United States Patent
Kumar et al.

(10) Patent No.: US 11,580,411 B2
(45) Date of Patent: Feb. 14, 2023

(54) SYSTEMS FOR INTRODUCING MEMRISTOR RANDOM TELEGRAPH NOISE IN HOPFIELD NEURAL NETWORKS

(71) Applicant: Hewlett Packard Enterprise Development LP, Houston, TX (US)

(72) Inventors: Suhas Kumar, Palo Alto, CA (US); Thomas Van Vaerenbergh, Palo Alto, CA (US); John Paul Strachan, Palo Alto, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 909 days.

(21) Appl. No.: 16/224,145

(22) Filed: Dec. 18, 2018

(65) Prior Publication Data

US 2020/0193300 A1 Jun. 18, 2020

(51) Int. Cl.
*G06N 3/10* (2006.01)
*G06N 3/06* (2006.01)
*G11C 13/00* (2006.01)

(52) U.S. Cl.
CPC ............ *G06N 3/10* (2013.01); *G06N 3/06* (2013.01); *G11C 13/0069* (2013.01); *G11C 2213/79* (2013.01)

(58) Field of Classification Search
CPC .......... G06N 3/10; G06N 3/06; G06N 3/0445; G06N 3/0635; G11C 13/0069; G11C 2213/79; G11C 2213/77; G11C 15/54
See application file for complete search history.

(56) References Cited

U.S. PATENT DOCUMENTS

| | | | |
|---|---|---|---|
| 2007/0229121 A1* | 10/2007 | Mouttet | H03K 19/177 327/100 |
| 2015/0170025 A1* | 6/2015 | Wu | G06N 3/0635 706/25 |
| 2019/0043581 A1* | 2/2019 | Yasuda | H03K 19/17728 |

OTHER PUBLICATIONS

Yu S. Neuro-inspired computing with emerging nonvolatile memorys. Proceedings of the IEEE. Jan. 23, 2018;106(2):260-85. (Year: 2018).*

* cited by examiner

*Primary Examiner* — Li B. Zhen
*Assistant Examiner* — Henry Nguyen
(74) *Attorney, Agent, or Firm* — Sheppard Mullin Richter & Hampton LLP

(57) ABSTRACT

Systems are provided for implementing a hardware accelerator. The hardware accelerator emulate a stochastic neural network, and includes a first memristor crossbar array, and a second memristor crossbar array. The first memristor crossbar array can be programmed to calculate node values of the neural network. The nodes values can be calculated in accordance with rules to reduce an energy function associated with the neural network. The second memristor crossbar array is coupled to the first memristor crossbar array and programmed to introduce noise signals into the neural network. The noise signals can be introduced such that the energy function associated with the neural network converges towards a global minimum and modifies the calculated node values.

20 Claims, 8 Drawing Sheets

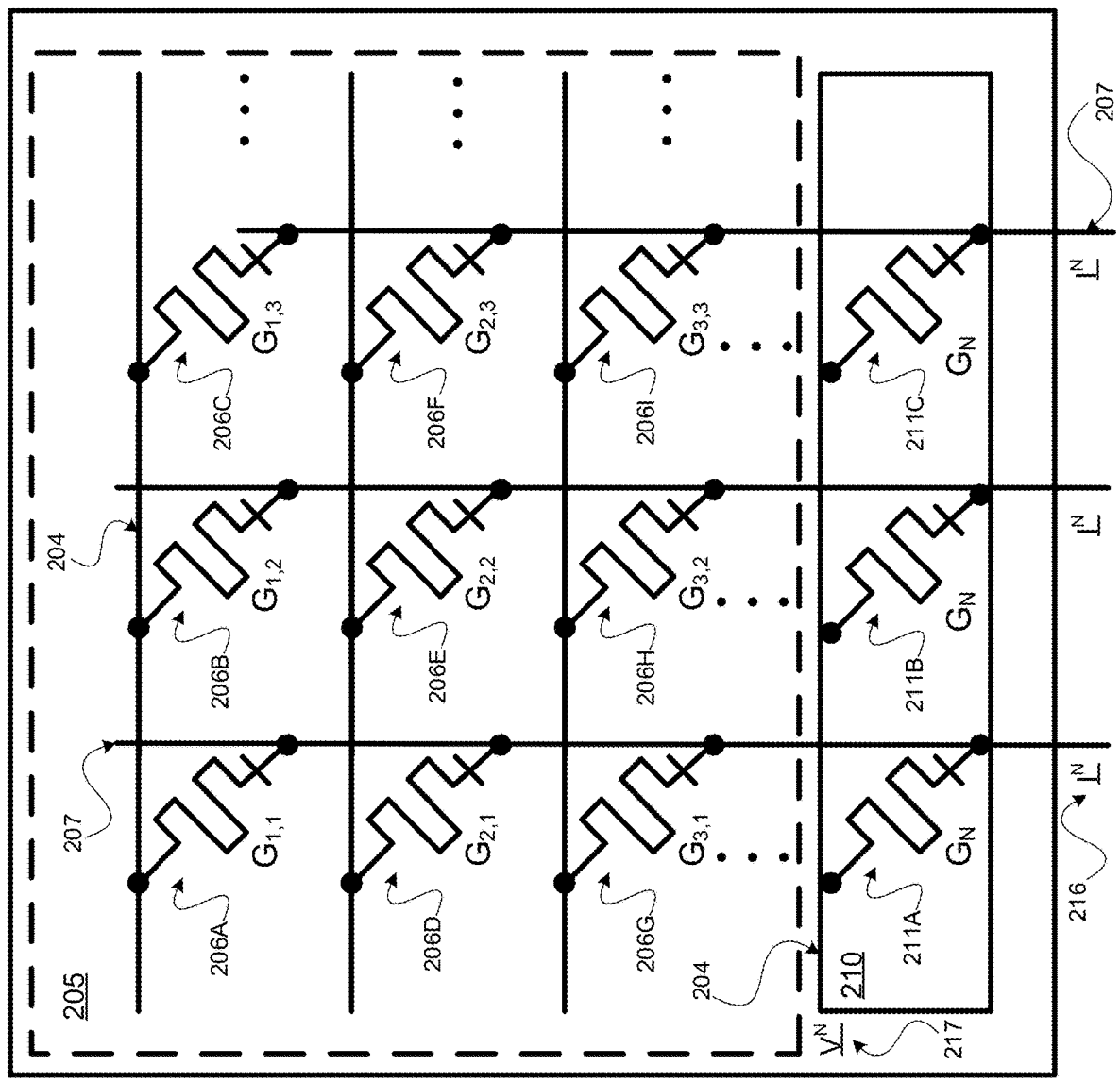

SYSTEMS FOR INTRODUCING MEMRISTOR RANDOM TELEGRAPH NOISE IN HOPFIELD NEURAL NETWORKS

DESCRIPTION OF RELATED ART

Artificial neural networks are a family of technical models based on biological nervous systems, which are used to estimate or approximate functions that depend on a large number of inputs. Neural networks may be represented as a system of interconnected "neurons" which exchange messages between each other. The connections may have numerical weights that can be tuned based on experience, making neural networks adaptive to inputs and capable of machine learning. Artificial neural networks may have a variety of applications, including function approximation, classification, data processing, robotics, and computer numerical control.

There may be various types of neural networks, including feedforward neural networks, radial basis function neural networks, recurrent neural networks, and other types. As a general description, Hopfield Neural Networks (HNNs) are a type of artificial neural network that involve computed iterative steps based on energy minimizing rules. The recurrent, or feedback characteristics of HNNs may be particularly suitable for implementing logic operations, solving optimization problems, performing analog-digital conversion, and implementing associative memories (e.g., content-addressable memories), for example. However, in some cases, models based on HNNs may experience limitations due to its computational properties. For instance, a Hopfield based system may converge at local minima of its energy function, which causes the computation to end without reaching a global minimum. This scenario has a high probability of occurring in HNN implementations, and may be problematic, as it is the global minimum of the network's energy function that typically produces optimal values, or most correct solution. Stabilization at local minima is a common drawback associated with HNNs (due to its energy minimizing properties), which affects the accuracy of its computations and serves as a deterrent from the widespread use of HNNs in various applications.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 2A illustrates an example of a circuit configuration including a memristor crossbar array for implementing a weight matrix of a neural network and the memristor crossbar array for introducing RTN into the emulated neural network shown in FIG. 1, according to some embodiments.

The figures are not exhaustive and do not limit the present disclosure to the precise form disclosed.

DETAILED DESCRIPTION

Various embodiments described herein are directed to hardware configured to emulate a logical neural network. Furthermore, the hardware has been adapted to include dedicated circuitry, namely a memristor crossbar array, that is designed for introducing random telegraph noise (RTN) into the emulated neural network for optimized performance.

Memristors are devices that may be used as components in a wide range of electronic circuits, such as memories, switches, radio frequency circuits, and logic circuits and systems. In a memory structure, a crossbar array of memory devices having memristors may be used. In memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("on") and one in which the channel forms a less conductive path ("off"). In some other cases, conductive paths represent "off" and less conductive paths represent "on". Furthermore, memristors may also behave as an analog component with variable conductance.

In some applications, a memory crossbar array can be used to perform vector-matrix computations. For example, an input voltage signal from each row line of the crossbar is weighted by the conductance of the resistive devices in each column line and accumulated as the current output from each column line. Ideally, if wire resistances can be ignored, the current (I) flowing out of the crossbar array will be approximately represented in the equation below:

$$I^T = V^T G \quad (1)$$

where V is the input voltage and G is the conductance matrix.

The memristor crossbar array is configured to include contributions from each memristor in the crossbar array. The use of memristors at junctions or cross-points of the crossbar array enables programming the resistance (or conductance) at each such junction.

Examples disclosed herein include hardware accelerators for calculating node values for neural networks. Example hardware accelerators may include a memristor crossbar array programmed to calculate node values. Memory cells of the memristor crossbar array may be programmed according to a weight matrix. Driving input voltages mapped from an input vector through the memristor crossbar array may produce output current values which may be compared to a threshold current to generate a new input vector of new node values. In this manner, example accelerators herein provide for hardware calculations of node values for neural networks.

Figure 1:
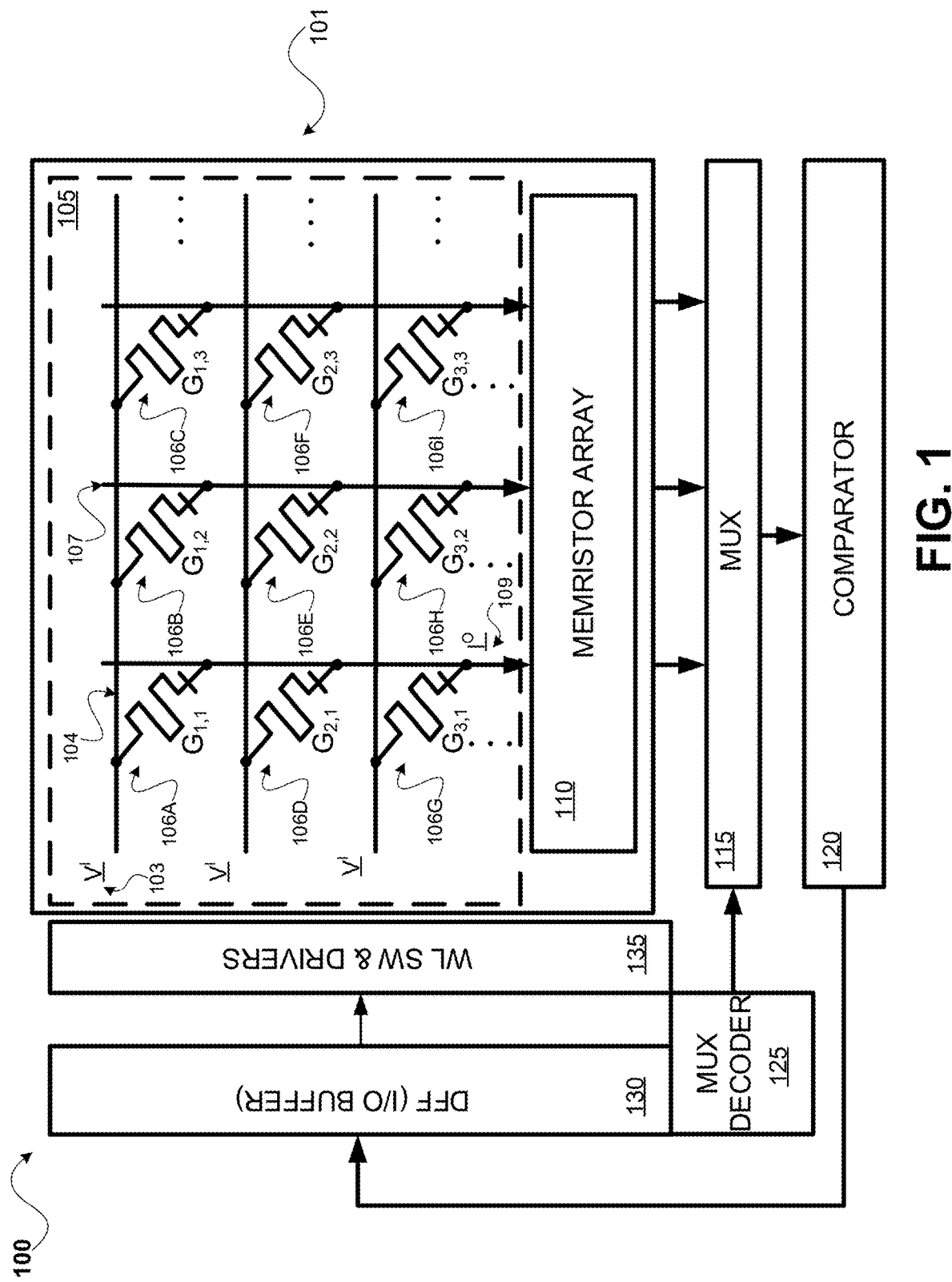
FIG. 1 depicts an example of a hardware accelerator system for calculating node values of a neural network, including a memristor crossbar array that introduces random telegraph noise (RTN) into the emulated neural network, according to some embodiments.

Referring now to the drawings, FIG. 1 illustrates an example hardware accelerator 100 according to the embodiments. Hardware accelerator 100 may be a hardware unit configured for calculating node values for neural networks. Hardware accelerator 100 may calculate new node values of a neural network by transforming an input vector in relation to a weight matrix. Hardware accelerator 100 may do so by calculating a vector-matrix multiplication of the input vector with the weight matrix.

In the example illustrated in FIG. 1, a Hopfield Neural Network (HNN) is particularly implemented by the hardware accelerator 100 described herein. FIG. 1 shows an implementation of the example hardware accelerator 100 having various components, including: a memristor crossbar array structure 101; multiplexer (MUX) 115; comparator 120; MUX decoder 125; delay flip-flop (DFF) (I/O Buffer) 130; and drivers 135. Additionally, in the hardware accelerator of FIG. 1, the memristor crossbar array structure 101 includes memristor crossbar array 105 in combination with an additional memristor crossbar array 110. Memristor crossbar array 105 can be configured to implement the weight matrix aspects of the HNN, as described above. Memristor crossbar array 110 can be configured for implementing the noise inducing aspects of the HNN, as further described in herein.

Figure 4:
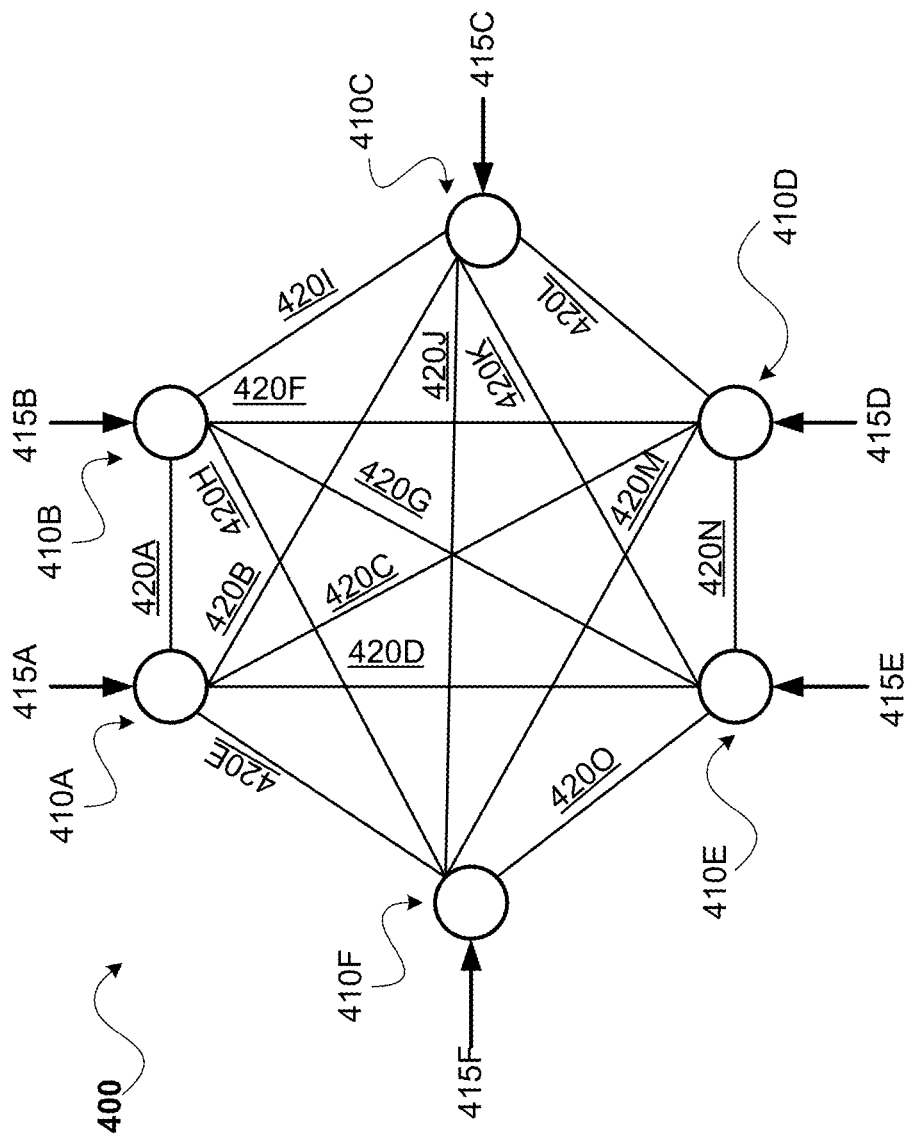
FIG. 4 depicts a conceptual model illustrating an example neural network.

As previously described, HNNs are a type of artificial neural network that can be used as a computational mechanism for various applications. A model of an HNN is conceptually illustrated in FIG. 4. Graphically, an HNN as a mathematical construct can be represented as graph 400 of a bidirectional (undirected) network with nodes $(s_i)$ 410A-410F and edges $(w_{ij})$ 420A-420O. Edges 420A-420O can be formed between each of the nodes 410A-410F. A computational "problem" can be encoded (or trained) in the edge weights and a threshold function. Input node values 415A-415F can be delivered to the nodes 410A-410F until the computational "answer" to the problem is determined by a final state for the node values. In this manner, an HNN can be a dynamic system, and the node values can evolve based on the edge weightings to all the other node values (e.g., as a dot product operation). The dynamics follow energy minimizing rules, such that the "energy" of the system does not increase, and thus can find a minimum. The final configuration of the nodes encodes the solution. Therefore the "energy" indicates whether the network is modified when an update occurs, and the system reaches its minimum energy when it becomes stable.

The HNN can be "trained" to a set of distinct inputs. As alluded to above, HNNs can employ update rules that minimize a network's energy function (e.g., only reducing energy at each successive update). It should be also be understood that in some cases, inputs are used as initial conditions, and the HNN is allowed to evolve to a rest state (e.g., without training by changing the weights). For example, an energy function of an HNN may be represented as the equation below:

$$E = \tfrac{1}{2} \Sigma_{i,j} w_{ij} s_i s_j + \Sigma_i \theta_i s_i \qquad (2)$$

Figure 3B:
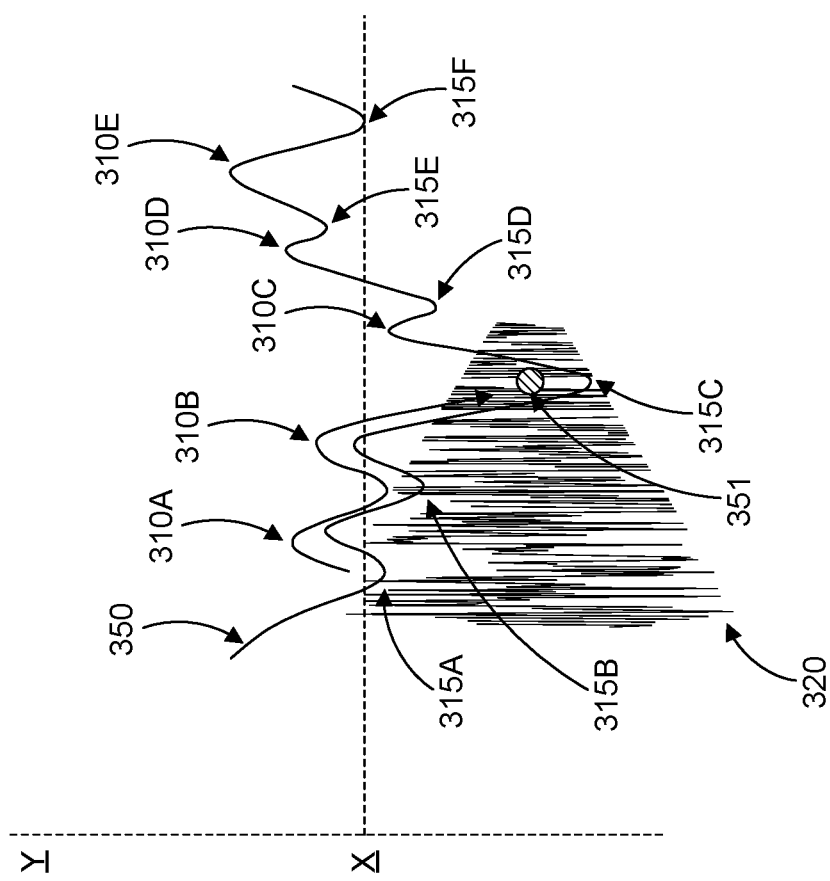
FIG. 3B is a graphical representation of an energy function associated with a neural network including a conceptually diagramed injected RTN, according to some embodiments.

Referring now to FIG. 3B, an example of a graphical representation of an energy function associated with an HNN is illustrated. It should be appreciated that FIG. 3B depicts the energy function corresponding to the HNN as a continuous function, whereas different implementations of an HNN can also correspond to a system with a discrete state energy function. As seen, an energy function can be represented as wave 350 being substantially sinusoidal in form, where an energy value for the HNN at a particular state corresponds to the vertical position (e.g., height) of the wave 350 along the y-axis of the graph (with respect to the x-y axis represented by dashed lines). The energy function of the HNN transitions from initial states (e.g., start of a set of inputs) having higher energy levels, illustrated as higher points 310A-310E of wave 350 with amplitudes in the (+) y direction (with respect to the x-y axis represented by dashed lines). In between each of the higher energy states, the network propagates through subsequent states having lower energy and eventually reaches a state with minimal energy. The minimal energy states are illustrated as lower points 315A-315F on wave 350 with an amplitude in the (−) y direction. Accordingly, node values calculated by the HNN also evolve towards energy minima, or the computational answer. Each set of inputs into the HNN can converge to its own answer, which corresponds to a respective minimum energy for that set on the energy graph, also referred to as local minima. Referring to FIG. 3B, updates to the evolving node values of the HNN are represented by ball 351. The position of the ball 351 along wave 350 corresponds to the system's energy, which impacts the node values calculated for that particular state. Thus, the HNN reaching a local minimum for a set of inputs can be represented on the energy graph by ball 351 being positioned at one of the low points 315A-315F on wave 350. For purposes of illustration, the local minima phenomena can generally be described in the energy graph as ball 351 resting in a valley. Each valley, or low point 315A-315F, produces respective node values that can be considered a computational answer. As such, an HNN has the potential to converge at any of the multiple "answers" (having an energy that becomes stable at any of the points 315A-315F on the graph) based on the received input.

A global minimum can be characterized as the optimally minimized energy of the HNN across multiple sets of inputs. Consequently, it is the global minimum (or global convergence) that represents the most accurate calculation by the HNN. In FIG. 3B, as each of the low points 315A-315F represents local minima for the energy function, the global minimum can be represented by the lowest point of wave 350 on the energy graph, or low point 315C. Restated, although the local minima of the energy function correspond to multiple potential computational answers, node values generated by the state at global minimum can be the optimal answer. As previously described, models based on HNN may experience limitations due to its computational properties. For instance, a system can stabilize at local minima (e.g., false solution to a problem) of the energy function. Referring back to the example, ball 351 may settle in one of the valleys at lower points 315A, 315B, 315D-315F in the energy graph. In order for the ball 351 to escape a valley, energy can be injected into the system to allow ball 351 to reach a higher energy level, climbing an upward slope to approach one of the higher points 310A-310E. However, as described above, HNNs characteristically do not increase its energy function. Consequently, in the event that the HNN stops evolving at local minima, then the system may be stuck at that state. The energy minimizing rule of HNNs may prevent ball 351 from escaping the valley, in turn preventing the system from ultimately reaching the global minimum (e.g., correct solution to a problem). As a result, hardware implementations of HNNs can also suffer from the negative impacts of local minima. The embodiments address local minima constraints by adapting the hardware accelerator 100 in FIG. 1, which emulates an HNN, to include noise inducing circuitry. In particular, the memristor crossbar array 110 is configured to generate random telegraph noise (RTN). Furthermore, the memristor crossbar array 110 introduces the RTN into the circuit in a manner that simulates injecting external energy into the energy graph of an HNN. Referring again to the example discussed in reference to FIG. 3B, the memristor crossbar array 110 is configured to introduce RTN such that energy is injected into the system, exciting the ball enough to escape the valley, or local minima. The disclosed systems and techniques may be particularly beneficial for the various applications of HNNs, modifying the circuit design of hardware accelerator 100 in order to increase the overall efficiency and accuracy of these systems. FIG. 3B also depicts that the amplitude of the noise signal 320 is gradually decreased using a simulated annealing approach, as described herein. As an example, more noise may be needed initially for enough excitation to jump out of local minima. Eventually, once global minima is reached, the need for the hill-climbing features of added noise is no longer needed. Thus, a small amount of noise, or no noise is more desirable in the global minima state. This illustrated in FIG. 3B, as the noise signal 320 is shown to have a gradually smaller amplitude approaching the global minima point 315C.

The embodiments provide an efficient and hardware driven solution, which realizes advantages over some existing approaches to address local minima associated with HNNs. For instance, quantum annealing is a known technique to mitigate local minima. Nonetheless, quantum annealing is a temperature-dependent solution, where the environment is controlled for cooling. The lower temperatures induce particles to initially lose energy, and subsequently pull energy from the environment to assume a higher energy state (thus avoiding local minima of the energy function). In the case of hardware implemented HNNs, cryogenic temperatures are used to achieve cooling of the circuits. Thus, quantum annealing often involves high energy consumption and system inefficiency. Furthermore, there is uncertainty regarding whether advancements in quantum annealing will be successful without requiring cooling. The embodiments integrate local minima escaping mechanisms into the HNN emulating circuitry itself, therefore reducing costs and providing an alternative to the other environmental control concerns of other approaches, such as quantum annealing.

Referring back to FIG. 1, hardware accelerator 100 can include memristor crossbar array 105 and memristor crossbar array 110. Memristor crossbar array 105 can be a configuration of parallel and perpendicular lines with memory cells coupled between lines at intersections. Memristor crossbar array 105 may include a plurality of row lines 104, a plurality of column lines 106, and a plurality of memory cells 106A-106I. Each of the memory cells 106A-106I may be coupled between each unique combination of one row line 104 and one column line 106. In other words, none of the memory cells 106A-106I share both a row line 104 and a column line 107.

Row lines 104 may be electrodes that carry current through memristor crossbar array 105. In some examples, row lines 104 may be parallel to each other, generally with equal spacing. Row lines 104 may sometimes be, for example, a top electrode or a word line. Similarly, column lines 106 may be electrodes that run nonparallel to row lines 104. Column lines 106 may sometimes be, for example, a bottom electrode or bit line. Row lines 104 and column lines 106 may serve as electrodes that deliver voltage and current to the memory cells 106A-106I. Example materials for row lines 104 and column lines 106 may include conducting materials such as Pt, Ta, Hf, Zr, Al, Co, Ni, Fe, Nb, Mo, W, Cu, Ti, TiN, TaN, $Ta_2N$, $WN_2$, NbN, MoN, $TiSi_2$, TiSi, $TiSi_3$, $TaSi_2$, $WSi_2$, $NbSi_2$, $V_3Si$, electrically doped polycrystalline Si, electrically doped polycrystalline Ge, and combinations thereof. In the example of FIG. 1, crossbar array 105 may have N row lines and M column lines.

Memory cells 106A-106I may be coupled between row lines 104 and column lines 106 at intersections of the row lines 104 and column lines 106. For example, memory cells 106A-106I may be positioned to calculate a new node values of an input vector of node values with respect to a weight matrix. Each of the memory cells 106A-106I may have a memory device such as a resistive memory element, a capacitive memory element, or some other form of memory.

In some examples, each of the memory cells 106A-106I may include a resistive memory element. A resistive memory element may have a resistance that changes with an applied voltage or current. Furthermore, in some examples, the resistive memory element may "memorize" its last resistance, either in a volatile or a non-volatile way. In this manner, each resistive memory element may be set to at least two states. In many examples, a resistive memory element may be set to multiple resistance states, which may facilitate various analog operations. The resistive memory element may accomplish these properties by having a memristor, which may be a two-terminal electrical component that provides memristive properties as described herein.

In some examples, a memristor may be nitride-based, meaning that at least a portion of the memristor is formed from a nitride-containing composition. A memristor may also be oxide-based, meaning that at least a portion of the memristor is formed from an oxide-containing material. Furthermore, a memristor may be oxy-nitride based, meaning that at least a portion of the memristor is formed from an oxide-containing material and that at least a portion of the memristor is formed from a nitride-containing material. Example materials of memristors may include tantalum oxide, hafnium oxide, titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, silicon nitride, and oxynitrides such as silicon oxynitride. In addition, other functioning memristors may be employed in the practice of the teachings herein.

A memristor may exhibit nonlinear or linear current-voltage behavior. Nonlinear may describe a function that grows differently than a linear function. In some implementations, a memristor may be linear or nonlinear in voltage ranges of interest. A voltage range of interest may be, for example, a range of voltages used in the operation of hardware accelerator 100. In some examples, memory cells 106A-106I may include other components, such as access transistors or selectors. For example, each of the memory cells 106A-106I may be coupled to an access transistor between the intersections of a row line 104 and a column line 106. Access transistors may facilitate the targeting of individual or groups of memory cells 106A-1061 for the purposes of reading or writing the memory cells.

Alternatively, a selector may be an electrical device that may be used in memristor devices to provide desirable electrical properties. For example, a selector may be a 2-terminal device or circuit element that admits a current that depends on the voltage applied across the terminals. A selector may be coupled to each of the memory cells 106A-1061 to facilitate the targeting of individual or groups of memory cells 106A-1061. For example, a selector may do so by acting like an on-off switch, and it may mitigate sneak current disturbance.

The memory cells 106A-1061 of memristor crossbar array 105 may be programmed according to a weight matrix of a neural network. A weight matrix may represent a compilation of operations of a neural network. For example, a weight matrix may represent the weighted edges of HNN illustrated in FIG. 4. The value stored in the memory cells 106A-1061 may represent the values of a weight matrix. In implementations of resistive memory, the resistance levels of each of the memory cells 106A-1061 may represent a value of the weight matrix. In such a manner, the weight matrix may be mapped onto crossbar array 105.

Memory cells 106A-1061 may be programmed, for example, by having programming signals driven through them, which drives a change in the state of the memory cells 106A-1061. The programming signals may define a number of values to be applied to the memory cells 106A-1061. As described herein, the values of memory cells 106A-1061 of crossbar array 105 may represent a weight matrix of a neural network, such as an HNN.

In continuing reference to FIG. 1, hardware accelerator 100 may receive an input vector of node values at the plurality of row lines 104. The input vector may include node values which are to be evolved into next input values for the neural network. The input vector node values may be converted to input voltages (V') 103 by a drive circuit, drivers 135. A drive circuit 135 may deliver a set of input voltages that represents the input vector to the memristor crossbar array 105. In some examples, the voltages 103 may be other forms of electrical stimulus such as an electrical current driven to the memory cells 106A-1061. Furthermore, in some examples, the input vector may include digital values, which may be converted to analog values of the input electrical signals by a digital-to-analog converter. In other examples, the input vector may already include analog values.

Upon passing through the memristor crossbar array 105, the plurality of column lines 107 may deliver output currents (I°) 109, where the output currents 109 may be compared to a threshold current according to an update rule to generate a new input vector of new node values. Details of these operations is described in below.

Hardware accelerator 100 may also include other peripheral circuitry associated with crossbar array 105. For example, an address decoder, MUX decoder 125, may be used to select a row line 104 and activate a drive circuit 135 corresponding to the selected row line 104. The drive circuit 135, for a selected row line 104, can drive a corresponding row line 104 with different voltages corresponding to a neural network or the process of setting resistance values within memory cells 106A-1061 of memristor crossbar array 105. Similar drive and decode circuitry may be included for column lines 107. Control circuitry may also be used to control application of voltages at the inputs and reading of voltages at the outputs of hardware accelerator 100. Digital to analog circuitry and analog to digital circuitry may be used for input voltages 103 and the output currents 109. In some examples, the peripheral circuitry above described can be fabricated using semiconductor processing techniques in the same integrated structure or semiconductor die as crossbar array.

As described herein, there are three main operations that occur during operation of the hardware accelerator 100. The first operation is to program the memory cells 106A-1061 in the memristor crossbar array 105 so as to map the mathematic values in an N×M weight matrix to the array. In some examples, N and M may be the same number, and the weight matrix is symmetrical. In some examples, each of the memory cells 106A-1061 are programmed at a time during the programming operation. The second operation is to calculate an output current by the dot-product of input voltage and the resistance values of the memory cells of a column line 107. In this operation, input voltages are applied, and output currents obtained, corresponding to the result of multiplying an N×M matrix by an N×1 vector. In some examples, the input voltages are below the programming voltages so the resistance values of the memory cells 106A-1061, such as resistive memory, are not changed during the linear transformation calculation. The third operation is to compare the output currents with a threshold current. For example, comparators 120 may compare the output currents with the threshold current to determine a new input vector of new node values.

In an example, hardware accelerator 100 may calculate node values by applying a set of voltages (V') 103 simultaneously along row lines 104 of the N×M crossbar array 105 and collecting the currents through column lines 107 and generating new node values. On each column line 107, every input voltage 103 is weighted by the corresponding memristance ($1/G_{ij}$) and the weighted summation is reflected at the output current. Using Ohm's law, the relation between the input voltages 103 and the output currents can be represented by a vector-matrix multiplication of the form: $\{V^O\}T = -\{V^I\}^T[G]$ Rs, where $G_{ij}$ is an N×M matrix determined by the conductance (inverse of resistance) of memristor crossbar array 105, Rs is the resistance value of the sense amplifiers and T denotes the transpose of the column vectors $V^O$ and $V^I$. The negative sign follows from use of a negative feedback operational amplifier in the sense amplifiers. From the foregoing, it follows that the hardware accelerator 100 can be utilized for multiplying a first vector of values $\{b_i\}^T$ by a matrix of values $[a_{ij}]$ to obtain a second vector of values where i=1, N and j=1, M. The vector operation can be set forth in more detail as follows:

$$a_{11}b_1 + a_{21}b_2 + \ldots + a_{N1}b_N = c_1$$

$$a_{1m}b_1 + a_2b_2 + \ldots + a_{NM}b_N = c_M \quad (3)$$

The vector processing or multiplication using the principles described herein generally starts by mapping a matrix of values $[a_{ij}]$ onto crossbar array 105 or, stated otherwise, programming (e.g., writing) conductance values $G_{ij}$ into the crossbar junctions of the memristor crossbar array 105.

With reference still to FIG. 1, in some examples, each of the conductance values $G_{ij}$ may be set by sequentially imposing a voltage drop over each of the memory cells 106A-1061. For example, the conductance value $G_{2,3}$ may be set by applying a voltage equal to $V_{Row2}$ at the second row line 104 of memristor crossbar array 105 and a voltage equal to $V_{Col3}$ at the third column line 107 of the array 105. The voltage input, $V_{Row2}$, may be applied to the second row line occurring at the second row line adjacent the j=1 column line. The voltage input, $V_{Col3}$, will be applied to the third column line adjacent either the i=1 or i=N location. Note that when applying a voltage at a column line 107, the sense circuitry for that column line may be switched out and a voltage driver switched in. The voltage difference $V_{Row2}-V_{Col3}$ will generally determine the resulting conductance value $G_{2,3}$ based on the characteristics of the memory cell 106f located at the intersection. When following this approach, the unselected column lines 107 and row lines 104 may be addressed according to one of several schemes, including, for example, floating all unselected column lines 107 and row lines 104 or grounding all unselected column lines and row lines. Other schemes involve grounding column lines 107 or grounding partial column lines 107. Grounding all unselected column lines and row lines is beneficial in that the scheme helps to isolate the unselected column lines and row lines to minimize the sneak path currents to the selected column line 107.

In accordance examples herein, memristors used in memory cells 106A-106I may have linear current-voltage relation. Linear current-voltage relations permit higher accuracy in the matrix multiplication process. However, memristor crossbar array 105 having linear memristors are prone to having large sneak path currents during programming of the array 105, particularly when the size of memristor crossbar array 105 is larger than a certain size, for instance, 32×32. In such cases, the current running through a selected memristor may not be sufficient to program the memristor because most of the current runs through the sneak paths. Alternatively, the memristor may be programmed at an inaccurate value because of the sneak paths.

To alleviate the sneak path currents in such instances, and especially when larger arrays are desired, an access device, such as an access transistor or a non-linear selector, may be incorporated within or utilized together with a memristor to minimize the sneak path currents in the array. More specifically, memory cell should be broadly interpreted to include memristive devices including, for example, a resistive memory element, a memristor, a memristor and transistor, or a memristor and other components.

Following programming, operation of linear transformation accelerator 100 proceeds by applying the input voltages 110 and comparing the output currents to threshold currents. The output current delivered from column lines 106 may be compared, by current comparator 116, with a threshold current. Current comparator 116 may be a circuit or device that compares two currents (i.e., output current and threshold current) and outputs a digital signal indicating which is larger. Current comparator 116 may have two analog input terminals and one binary digital output.

Additionally, FIG. 1 shows that the hardware accelerator 100 can include a noise inducing memristor crossbar array 110 implementing the local minima tolerant aspects described above. In the illustrated example of FIG. 1, the memristor crossbar array 110 for RTN can be additional to the N×M structure of memristor crossbar array 105 configured for mapping the weight matrix. FIG. 2A shows an example of a circuit configuration for the arrays comprising the memristor crossbar array structure 101 in FIG. 1, and prominently illustrating a configuration for the noise inducing memristor crossbar array 210. The memristor crossbar array 210 for RTN can principally include the elements of the weight matrix memristor crossbar array described in detail above. As shown in FIG. 2A, the memristor crossbar array 210 includes a plurality of column lines 207, a row line 204, and memory cells 211A-211C. For purposes of brevity, the elements of memristor crossbar array 210 are substantially similar to the memristor crossbar array discussed above in reference to FIG. 1, and therefore is not discussed in detail again.

In the configuration of FIG. 2A, memristor crossbar array 210 can be generally described as an additional row to the memristor crossbar array 205. In detail, memristor crossbar array 210 is configured to have the same number of column lines 207 as the memristor crossbar array 205. Furthermore, the memristor crossbar array 210 can be operably coupled to memristor crossbar array 205. As shown in FIG. 2A, each column line 207 of memristor crossbar array 210 is coupled to a correspond column line 207 of the memristor crossbar array 205 such that each of the memory cells 211A-211C is vertically aligned (in a column) with memory cells 206A-206I. For example, coupling the arrays can align memory cell 211A of memristor crossbar array 210 with memory cells 206A, 206D, 20G of memristor crossbar array 205, forming a contiguous column. The memristors of memory cells 206A-206A (located at each intersection of column lines 207 and row lines 204 in array 205) are configured for tuning weights of the emulated HNN. The memristors of memory cells 211A-211C (located at each intersection of column lines 207 and row line 204 in array 210) can be programmed for tuning noise injected in the emulated HNN. The memory cells 211A-211C may also be programmed, as described above about the memory cells 106A-106I.

Figure 2B:
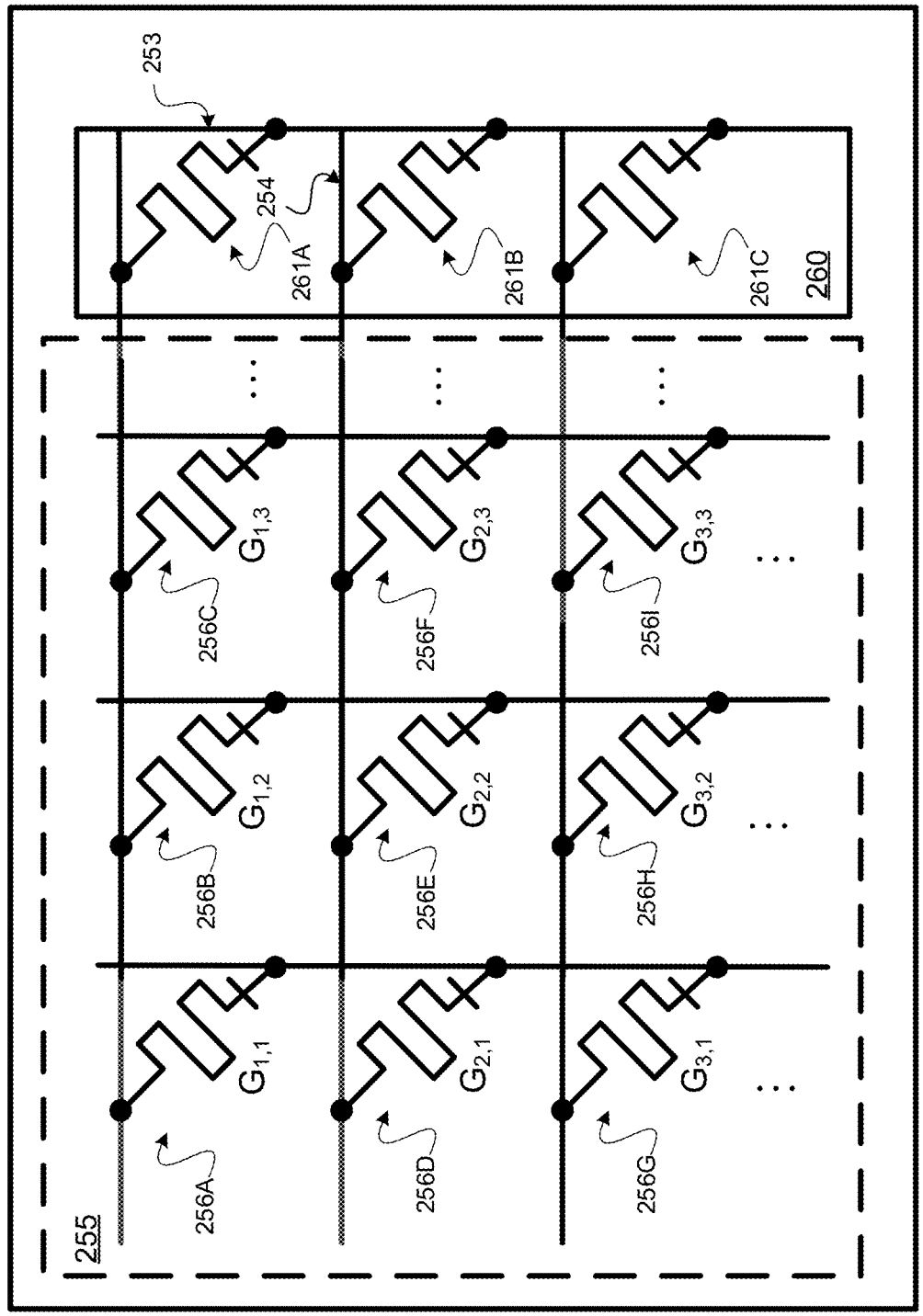
FIG. 2B illustrates another example of a circuit configuration including a memristor crossbar array for implementing a weight matrix of a neural network and the memristor crossbar array for introducing RTN into the emulated neural network, according to some embodiments.

Referring now to FIG. 2B, an alternate configuration for the noise inducing memristor crossbar array 260 is shown. It should be appreciated that the memristor crossbar array 255 and the memristor crossbar array 260 illustrated in FIG. 2B is an example circuit configuration for the arrays that may comprise the memristor crossbar array structure 101 of FIG. 1. Referring back to FIG. 2B, the example illustrates the memristor crossbar array 260 configured as an additional column coupled to the N×M structure of crossbar array 255. In contrast to FIG. 2A, the memristor crossbar array 260 includes a column line 254, and multiple row lines 253. Each row line 254 of memristor crossbar array 260 can be coupled to a correspond row line 254 of the memristor crossbar array 255 such that each of the memory cells 261A-261C is horizontally aligned (in a row) with memory cells 206A-206I. It should be appreciated that implementations of the hardware accelerator, including the noise inducing memristor crossbar array, are not limited to the examples of FIGS. 2A-2B. Accordingly, the disclosed hardware accelerator, and the components therein, can be arranged in various other circuit configurations as deemed appropriate and/or necessary. For example, the memristor crossbar array 260 can be configured to include multiple rows and multiple columns.

Figure 2C:
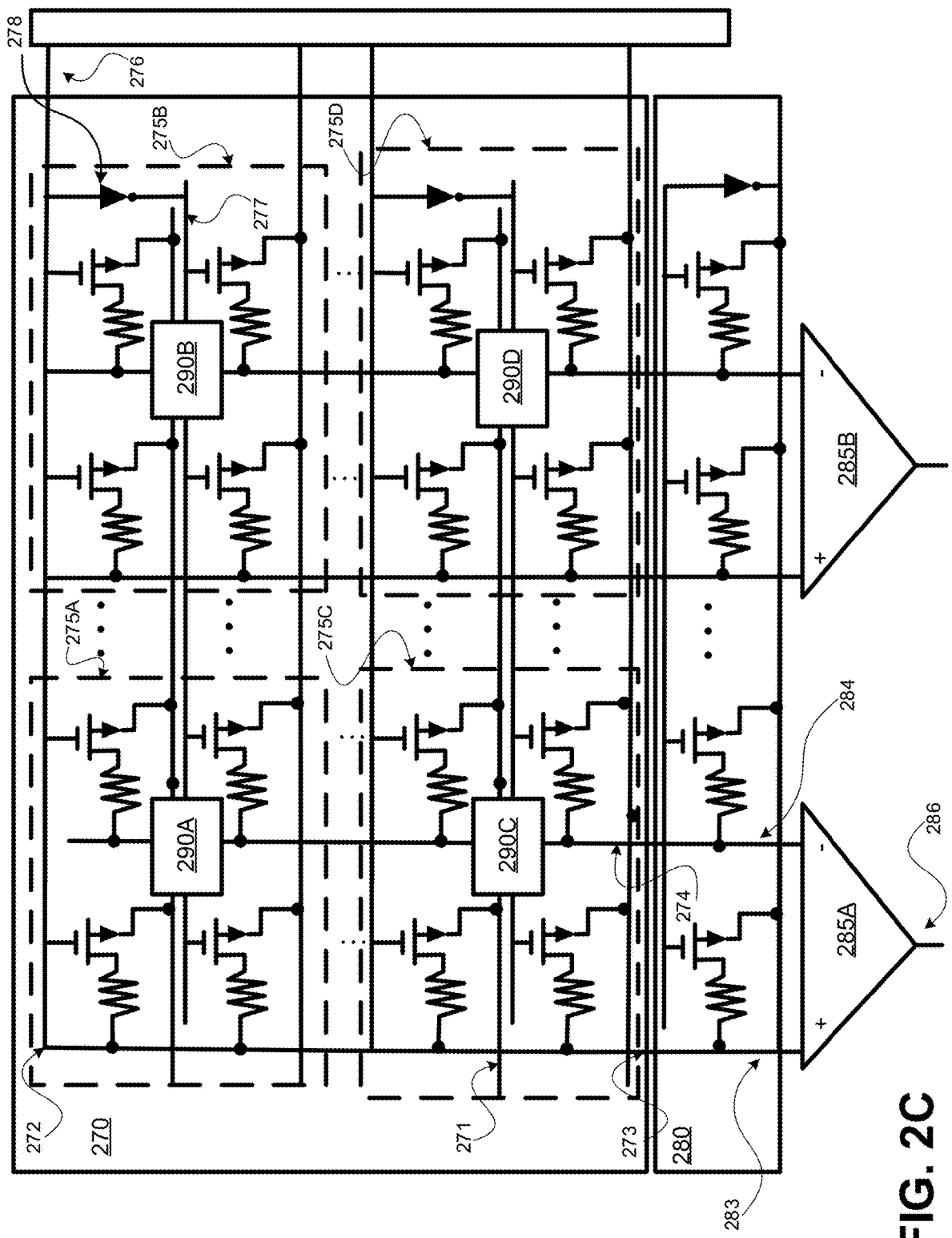
FIG. 2C illustrates another example of a circuit configuration including a memristor crossbar array for implementing a weight matrix of a neural network and the memristor crossbar array for introducing RTN into the emulated neural network, according to some embodiments.

FIG. 2C illustrates another example of a weight matrix memristor crossbar array 270 arranged in an n×n array, coupled to the additional noise inducing crossbar array 280. In an embodiment, the memristor crossbar array structure 101, as seen in FIG. 1, can be implemented using the circuit configuration for the memristor crossbar array 270 and the memristor crossbar array 280 shown in FIG. 2C. The memory crossbar array 270 may be implemented as a bipolar array, comprising an array of memory cells 275A-275D. In the illustrated example, an input vector 298 may be provided to the memristor crossbar array 270. The number of memory cells may be a function of a number of values in a weight matrix. For example, if there are nine values in the weight matrix, then the weight matrix memory crossbar array 270 may include nine memory cells.

Each of the memory cells 275A-275D may be comprised of a 2×2 memristor array 290A-290D, respectively. The 2×2 memristor arrays 290A-290D may be arranged in an n×n array. Thus, if there are nine memory cells 275A-275D, there may be three rows of 2×2 memristor arrays 290A-290D, where each row has three columns of 2×2 memristor arrays 290A-290D. A plurality of rows 271 and a plurality of columns 272 may be deployed for the n×n array.

In one example, each row of 2×2 memristor arrays 290A-290D may share an input 276, an inverter 278, and an inverted input 277. In one example, each column of the memory cells 275A-275D may generate an output 273 and 274 that may be fed into the noise inducing crossbar array 280. As discussed in detail above, the noise inducing crossbar array 280 can be configured to add noise in parallel to the outputs 273 and 274 generated by the memristor crossbar array 270. Additionally, the resulting output from the memristor crossbar array 280, output 283 and 284, serves as input into comparator 285A. For example, a column of memory cells 275A and 275C of the memristor crossbar array 270, including memory cell 281A of the noise inducing memristor crossbar array 280 (vertically aligned forming a congruent column) may generate the outputs 283 and 284 that are fed to the comparator 285A. The comparator 285A may then generate an output 286. Similarly, each column of memory cells may generate outputs that are fed to a comparator 285n. The comparator 285n may then generate a respective output, and so forth.

Figure 3A:
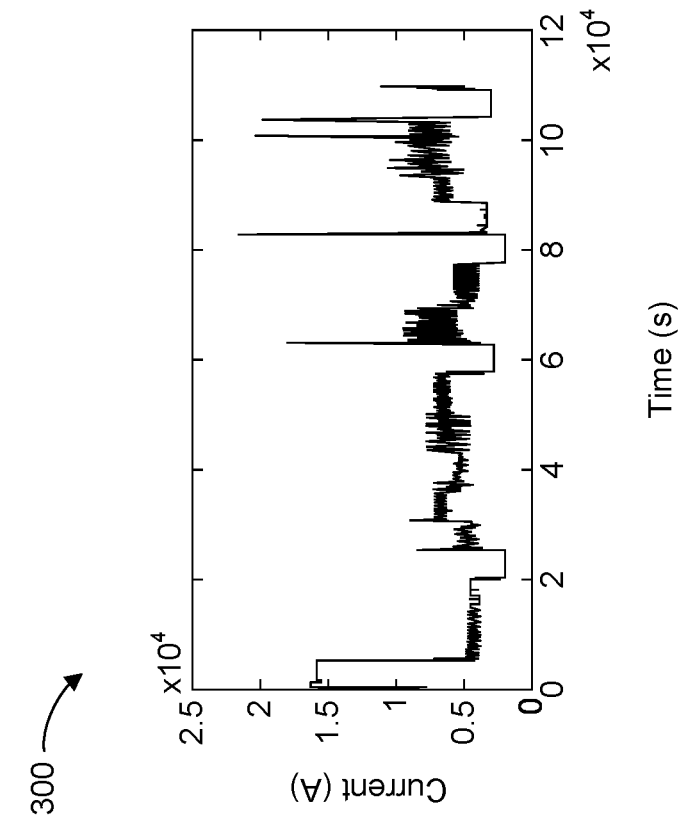
FIG. 3A depicts a graphical representation of a random telegraph noise signal generated by the memristor crossbar array shown in FIG. 2A, according to some embodiments.

Again, referring to FIG. 2A, the memristor crossbar array 210 functions to introduce noise into the output of the circuitry (shown in FIG. 1), thereby implementing the local minima avoidance techniques alluded to above. According to the embodiments, a conductance ($G_N$) of the memory cells 211A-211C of memristor crossbar array 210 can be set, or otherwise adjusted, in order to produce a noise current ($I^N$) 216. The noise current 216 may fluctuate (e.g., current value changing asynchronously) to replicate the bursty and random characteristics of noise. In some instances, the noise current 216 is a bipolar (+/−) signal. According to the embodiments, the noise current 216 is generated as RTN. RTN is a type of electronic noise (e.g., burst noise) that can occur in semiconductors and ultra-thin gate oxide films. It should be understood that RTN is an example of noise for purposes of discussion Thus, the disclosed memristor crossbar array 210 is not limited to generating RTN, being capable of producing other forms of noise as deemed appropriate. In some cases, each of the memory cells 211A-211C can be configured to have a fluctuating conductance, which in turn yields fluctuating currents as an output. A voltage ($V^N$) 217 can be applied to the row line 204 as input into memristor crossbar array 210. The value for the voltage 217 can be selected as deemed appropriate, driving a voltage across the memory cells 211A-211C that produces the noise current. According to the embodiments, the conductance for each of the memory cells 211A-211C is tuned to match a desired energy function of the emulated HNN. Therefore, the noise current output from memristor crossbar array 210 can be summed with the output of the weight matrix memristor crossbar array 205, replicating the excitation of states in the energy graph of an HNN described in reference to FIG. 3B. Referring once again to FIG. 3B, an example of a noise signal 320 that may be generated by the noise inducing crossbar array 210 is shown. The noise signal 320 can fluctuate the local energy, giving the system the necessary impulse to "hill-climb" over an energy barrier. Noise signal 320 can excite the system such that ball 351 escapes from local minima to reach a more favorable state in terms of global energy. This is implemented by the hardware, as the noise current output from the crossbar array 210 modifies the output current values resulting from the computations of memristor crossbar array 205. In this manner, the noise current can cause the generation of new node values for the emulated HNN which may be more optimal because of the local minima tolerant aspects of noise. FIG. 3A depicts a graphical 300 of a RTN signal that may by generated by the memristor crossbar array 210. The graph 300 illustrates noise as a function of current (Amperes) versus time (seconds). As seen in FIG. 3A, the RTN signal can be qualitatively described as randomly fluctuating bursts.

As previously described, the column lines 207 of memristor crossbar array 210 in FIG. 2A is aligned with the column lines 207 of the memristor crossbar array 207. The noise current generated by memristor crossbar array 210 is similarly output across each of the column lines 207, which injects noise at every line of output from the memristor crossbar array 205. As such, the configuration of FIG. 2B adds noise in parallel to the weight matrix computations of the memristor crossbar array 205. Due to these parallel capabilities, the noise inducing hardware is highly compatibility with the HNN emulating hardware, maintaining advantages of the crossbar implementation (e.g., parallel computing). As an example of parallel operation, output from both the weight matrix memristor crossbar array 205 and the noise inducing memristor crossbar array 210 can be calculated in a single clock cycle. In one implementation, the memristors, of memristor crossbar array 260 for example, can be biased using a voltage source connected either (a) directly across the memristor or (b) connected across a series combination of a (linear or nonlinear) resistor and a plurality of memristors, such that the resistance level of the memristors is close to quantum conductance. In this implementation, the current through the memristor(s) may exhibit fluctuations, which in one example may embody random telegraph noise. The voltage across the memristor(s) may be tuned to tune the magnitude of noise and to change the behavior of the current between noisy and non-noisy. Alternately, in an additional implementation, the current through the memristor(s) can be tuned to alter the conductance of the memristor(s) in order to control and generate noise functions.

As previously discussed, adding the noise current 216 generated by memristor crossbar array 210 can produce an output-modification current for each column line 207. The output-modification current can be described as the output current of the N×M portion of the memristor crossbar array 205, which is a dot-product current of the input vector and the weight matrix, with nose injected therein. The output-modification current may then be used to calculate new node values. In some examples, a comparator (shown in FIG. 1) may be coupled to each column lines 207. Because the memristor crossbar array 210 has uniquely modified the output current of each column line 207 single comparator may be used at each column line 207 and a same current for comparison may be delivered to each current comparator. Based on the update rule, the hardware accelerator of the embodiments may generate a new input vector of new node values.

Now, referring back to FIG. 1, the comparator 210 may determine a new node value for the emulated HNN. The new node values may be aggregated to generate a new input vector. For example, each output current may be compared by an update rule. A new node value corresponding to a particular output current can be set to a first value if the particular output current is greater than or equal to the threshold current, $\theta_i$. The new node value can be set to a second value if the particular output current is less than the threshold current. Each output current may be represented as the sum of the products of an input vector with the weight matrix. For example, the update rule may be represented as the equation that follows:

$$s_i = \begin{cases} +1 & \text{if } \Sigma_j w_{ij} s_j \geq \theta_i \\ -1 & \text{otherwise} \end{cases} \quad (4)$$

The node values may also be programmed to attain values of +1 or 0, rather than +1 and −1 in the above equation. Any other pair of values may also be used. In some examples, the threshold currents may be delivered to the current comparators 116 via circuitry independent from crossbar array 102. Furthermore, in some examples, column lines 107 may have different threshold currents associated with it. This is further described below. Alternatively, each column line 106 may be associated with a same threshold current.

Upon delivery of the new input vector of new node values, a controller may determine whether the new node values are final node values of the HNN. A neural network, for example, may be modeled to determine a minimum energy of a system. In such an example, a controller can determine whether the new node values, which here represents an energy of the system, are a local minimum of the system. In response to a controller determining that the new node values are not final node values, the new input vector can be converted to input voltages to be delivered to the plurality of row lines of the crossbar array 105. In such a manner, the hardware accelerator 100 can be recurrent to calculate an iterative problem, such as determining a minimum energy of a system, implementing an HNN as hardware.

In some cases, the hardware accelerator 100 can be implemented as an engine in a computing device. Example computing devices that include an example accelerator may be, for example, a personal computer, a cloud server, a local area network server, a web server, a mainframe, a mobile computing device, a notebook or desktop computer, a smart TV, a point-of-sale device, a wearable device, any other suitable electronic device, or a combination of devices, such as ones connected by a cloud or internet network, that perform the functions described herein.

Figure 5:
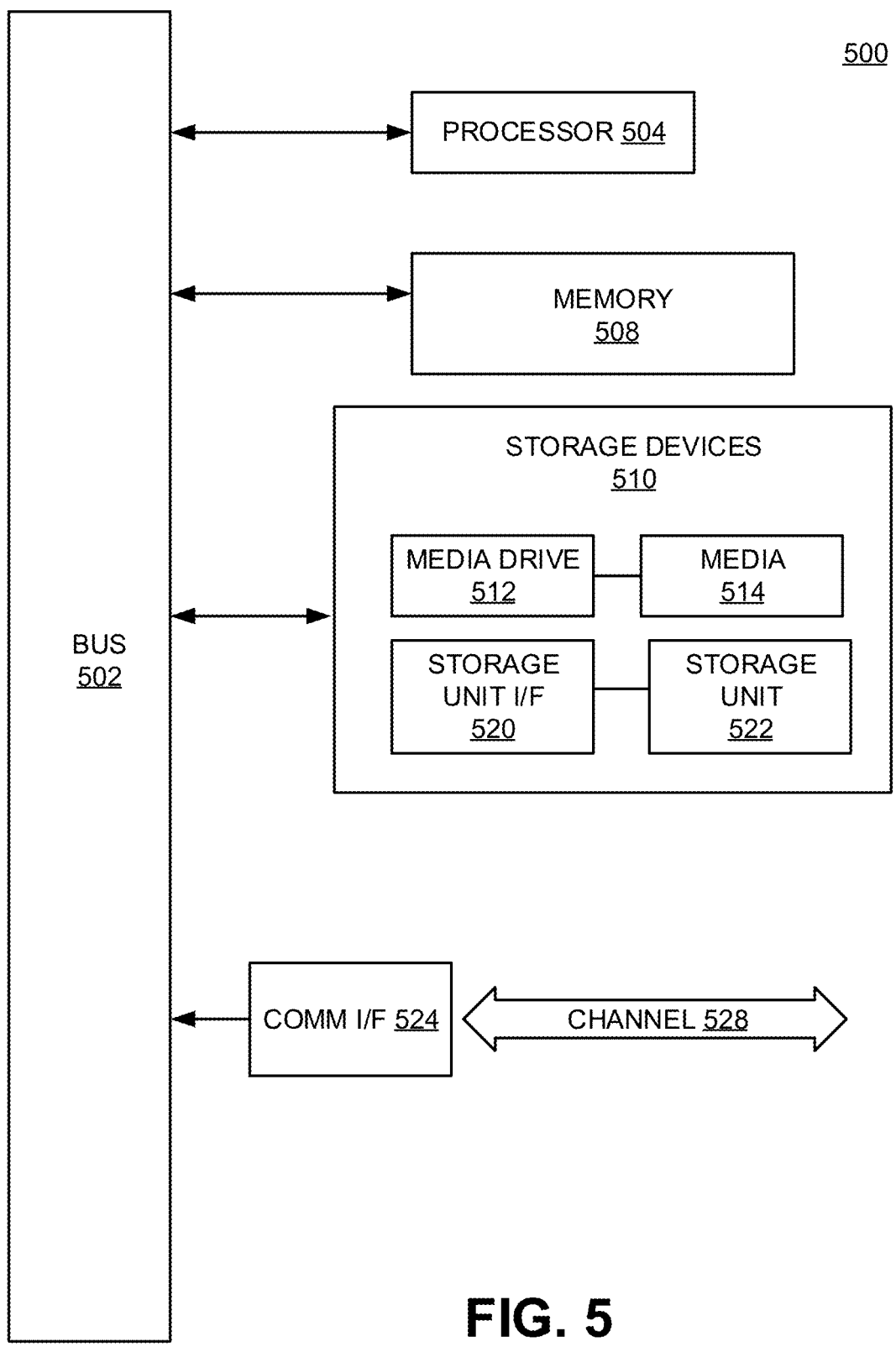
FIG. 5 illustrates an example computer system that may include the hardware accelerator emulating a neural network shown in FIG. 1, according to some embodiments.

FIG. 5 depicts a block diagram of an example computer system 500 in which the hardware accelerator 100 of the embodiments described herein may be implemented. The computer system 500 includes a bus 502 or other communication mechanism for communicating information, one or more hardware processors 504 coupled with bus 502 for processing information. Hardware processor(s) 504 may be, for example, one or more general purpose microprocessors.

The computer system 500 also includes a main memory 508, such as a random-access memory (RAM), cache and/or other dynamic storage devices, coupled to bus 502 for storing information and instructions to be executed by processor 504. Main memory 508 also may be used for storing temporary variables or other intermediate information during execution of instructions to be executed by processor 504. Such instructions, when stored in storage media accessible to processor 504, render computer system 500 into a special-purpose machine that is customized to perform the operations specified in the instructions.

The computer system 500 further includes storage devices 510 such as a read only memory (ROM) or other static storage device coupled to bus 502 for storing static information and instructions for processor 504. A storage device 510, such as a magnetic disk, optical disk, or USB thumb drive (Flash drive), etc., is provided and coupled to bus 502 for storing information and instructions.

The computer system 500 may be coupled via bus 502 to a display 512, such as a liquid crystal display (LCD) (or touch screen), for displaying information to a computer user. An input device 514, including alphanumeric and other keys, is coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. In some embodiments, the same direction information and command selections as cursor control may be implemented via receiving touches on a touch screen without a cursor.

The computing system 500 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor(s) 504 executing one or more sequences of one or more instructions contained in main memory 508. Such instructions may be read into main memory 508 from another storage medium, such as storage device 510. Execution of the sequences of instructions contained in main memory 508 causes processor(s) 504 to perform the process steps described herein. In alternative embodiments, hardwired circuitry may be used in place of or in combination with software instructions.

Figure 6:
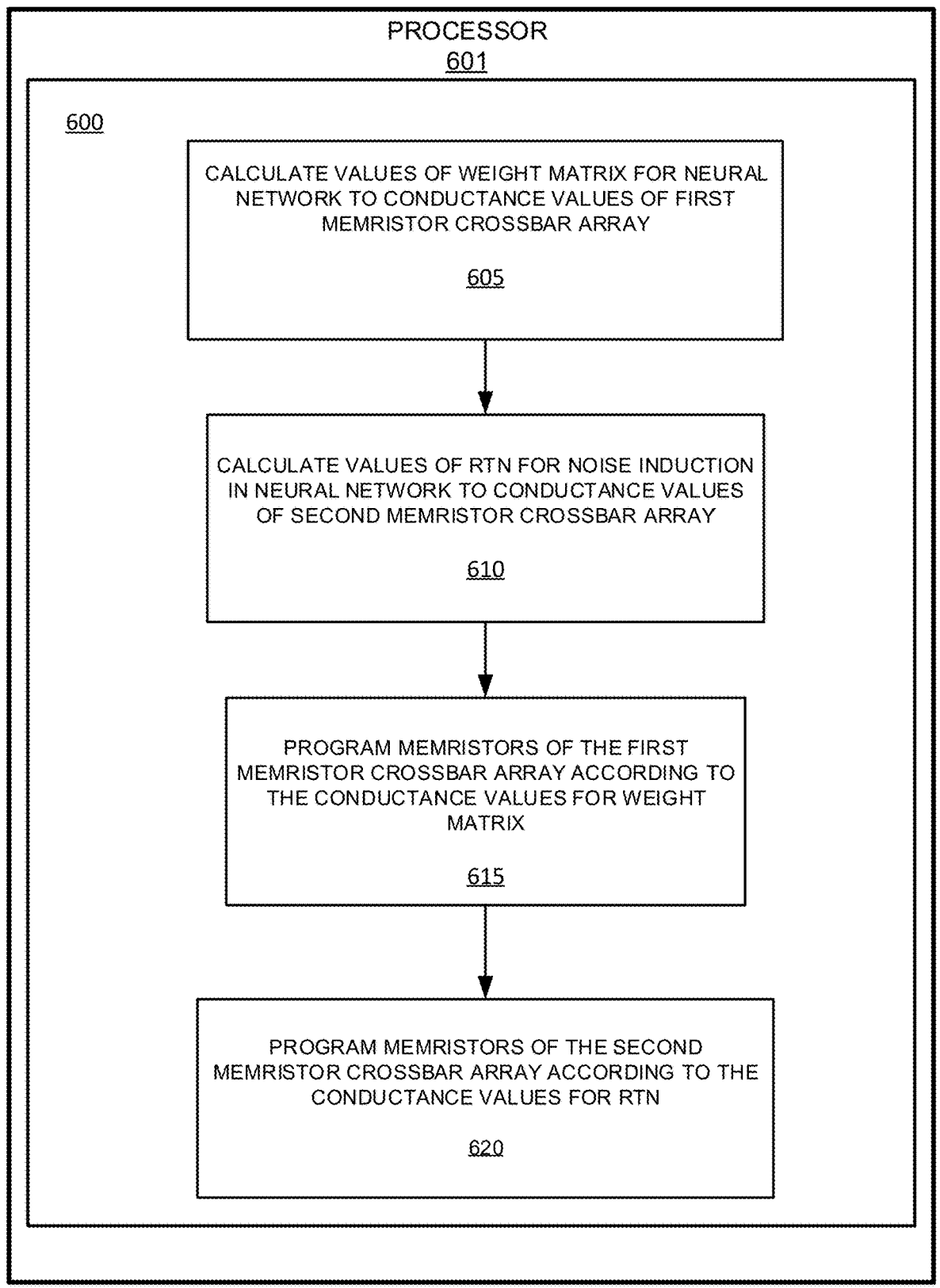
FIG. 6 is an operational flow diagram illustrating an example of a process for executing techniques to emulate a neural network and introduce RTN into the emulated neural network, according to some embodiments.

FIG. 6 is an operational flow diagram illustrating an example of a process 600 for executing techniques to emulate a neural network using hardware. Additionally, process 600 includes introducing RTN into the emulated neural network, in accordance with the hardware and circuit configurations previously discussed herein. In some cases, process 600 is performed in connection with the use of the hardware accelerator. Furthermore, FIG. 6 shows process 600 as a series of executable operations performed by processor 601, which can be the main processor of a computer device including the disclosed hardware accelerator (including the circuitry therein). Processor 601 executes the operations of process 400, thereby implementing the disclosed techniques.

At operation 605, a weight matrix may be converted to conductance values of a first memristor crossbar array. The first memristor crossbar array may be implemented using any of the circuit configurations described in detail in reference to FIG. 2A-2C, for example. The weight matrix may represent a neural network, such as an HNN. Furthermore, the weight matrix may be used for calculating values of nodes of the neural network. As described above, values stored in memory cells of the first memristor crossbar array can represent the values of the weight matrix. In implementations or resistive memory, the resistance levels of each memory cell may represent the values of the weight matrix. In such a manner, the weight matrix may be mapped onto the memristor crossbar array.

Then, at operation 610, noise values may be converted to conductance values of a second memristor crossbar array. In some cases, noise values are generated in accordance with a noise function and an energy function of a neural network (described in detail in reference to FIG. 3B). That is, the noise values may represent noise, such as RTN, in manner that is introduced into the emulated neural network to avoid local minima of its a given energy function. The conversion can represent the noise values as corresponding conductance values for memristors of the second memristor crossbar array. These conductance values for memristors of the second memristor crossbar array are determined such that a desired magnitude of current is output into the circuitry to act as noise (or a noise level). In such a manner, RTN may be mapped onto the second memristor crossbar array.

In an operation 615, memory cells of the first memristor crossbar array, including memristors, may be programmed according to the conductance values converted in operation 610. As described previously, memory cells may be programmed, for example, by having programming signals driven through them, which drives a change in the state of the memory cells. Thus, the first crossbar array is configured to calculate nodes values in accordance with calculating a dot-product of an input vector of the neural network with the weight matrix.

Next, at operation 620, the second memristor crossbar can be programmed according to the conductance values for RTN. In some cases, programming can involve biasing the memristors of the second memristor crossbar array using a voltage source, such that the resistance level of the memristors is close to conductance converted in operation 610. Accordingly, the current through the memristor(s) may exhibit fluctuations, which in one example may embody random telegraph noise. Furthermore, programming can involve tuning the voltage across the memristor(s), in order to tune the magnitude of noise and to change the behavior of the current (e.g., noisy and non-noisy). In some cases, programming involves tuning the current through the memristors to alter the conductance of the memristors, thereby generating the noise functions. As a result, the second crossbar array is hardware that functions to simulate introduction of noise signals into the neural network and modifies the calculated node values of the emulated neural network generated by the first memristor crossbar array. According to the embodiments, noise inducing memristor crossbar array can simulate annealing for HNNs (e.g., escaping local minima), and thereby improving accuracy of the emulated neural network.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 500.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A hardware accelerator, comprising:
a first memristor crossbar array programmed to calculate node values of a neural network, wherein the nodes values are calculated in accordance with rules to reduce an energy function associated with the neural network, the first memristor crossbar array comprising:
a plurality of first weight lines,
a plurality of second weight lines, and
a plurality of memory cells, wherein each of the plurality of memory cells is coupled across an intersection of one of the plurality of first weight lines and one of the plurality of second weight lines; and a second memristor crossbar array coupled to the first memristor crossbar array and programmed to introduce noise signals into the neural network, wherein the noise signals are introduced such that the energy function associated with the neural network converges towards a global minimum and modifies the calculated node values, the second crossbar array comprising:

a first noise line;

a plurality of second noise lines, wherein a number of the plurality of second lines is equal to a number of the plurality of first weighted lines for the first crossbar array such that each of the plurality of second noise lines is connected to one of the plurality of first weighted lines for the first crossbar array; and a plurality of noise memory cells, wherein each of the plurality of noise memory cells are coupled across an intersection of the first noise line and one of the plurality of second noise lines.

2. The hardware accelerator of claim 1, wherein:

the second plurality of weight lines is a plurality of weight row lines;

the second plurality of weight lines is a plurality of weight column lines; and wherein the plurality of memory cells are programmed according to a weight matrix to output a calculated node value of the neural network across each of the plurality of weight column lines.

3. The hardware accelerator of claim 1, wherein:

the first noise line is a noise row line;

the plurality of second noise lines is a plurality of noise column lines; and each of the plurality of noise memory cells is coupled across an intersection of the noise row line and one of the plurality of noise column lines.

4. The hardware accelerator of claim 1, wherein each of the plurality of noise memory cells are tunable to output a noise signal having a fluctuating current across the noise column line.

5. The hardware accelerator of claim 4, wherein the first noise line receives a controlled input voltage that tunes a conductance value for each of the plurality of noise memory cells to output the noise signal.

6. The hardware accelerator of claim 5, wherein the noise signals are generated in accordance with random telegraph noise such that the calculated node values output by the first memristor crossbar array are modified.

7. The hardware accelerator of claim 5, wherein the second memristor crossbar array outputs the noise signals in parallel with the output of the calculated node values from the first memristor crossbar array.

8. The hardware accelerator of claim 1, wherein each of the noise memory cells comprise a memristor.

9. The hardware accelerator of claim 1, wherein the modified calculated node values correspond to a solution of a computational problem mapped to the neural network.

10. The hardware accelerator of claim 9, wherein the neural network is emulated by the hardware accelerator.

11. The hardware accelerator of claim 1, wherein the neural network comprises a Hopfield Neural Network (HNN).

12. A hardware accelerator, comprising:

a first memristor crossbar array programmed to calculate node values of a neural network, wherein the nodes values are calculated in accordance with rules to reduce an energy function associated with the neural network, and wherein the first memristor crossbar array comprises:

a plurality of weight row lines;

a plurality of weight column lines; and a plurality of memory cells, wherein each of the plurality of memory cells are coupled across an intersection of one the plurality of weight row lines and one of the plurality of weight column lines and programmed according to a weight matrix to output a calculated node value of the neural network across each of the plurality of weight column lines; and a second memristor crossbar array coupled to the first memristor crossbar array and programmed to introduce noise signals into the neural network, wherein the noise signals are introduced such that the energy function associated with the neural network converges towards a global minimum and modifies the calculated node values, and wherein the second memristor crossbar array comprises:

a plurality of noise row lines, wherein a number of the plurality of noise row lines is equal to a number of the plurality of weighted row lines for the first memristor crossbar array such that each of the plurality of noise row lines is connected to one of the plurality of weighted row lines for the first memristor crossbar array;

a noise column line; and a plurality of noise memory cells, wherein each of the plurality of noise memory cells are coupled across an intersection of the noise row line and one of the plurality of noise column lines.

13. The hardware accelerator of claim 12, wherein the plurality of noise memory cells comprises memristors and the neural network comprises a Hopfield Neural Network (HNN).

14. The hardware accelerator of claim 13, wherein a conductance of each of the memristors is tunable to output a noise signal having a fluctuating current across the noise row lines.

15. The hardware accelerator of claim 14, wherein the noise signals are generated in accordance with random telegraph noise (RTN) such that the calculated node values output by the first memristor crossbar array are modified.

16. The hardware accelerator of claim 15, wherein the first memristor crossbar array outputs currents representing a dot-product computation based on the weight matrix to calculate the node value of the neural network.

17. The hardware accelerator of claim 16, wherein the modified node values are updated in accordance with an update rule to generate new inputs values into the neural network for a calculation of new node values.

18. The hardware accelerator of claim 17, comprising a controller is programmed to:

determine whether the new node values are final node values of the neural network; and upon determining that the new node values are not final node values, mapping the new input values to input voltages to be received as input by the plurality of weighted row lines of the first memristor crossbar array.

19. The hardware accelerator of claim 18, where the controller is further programmed to:

upon determining that the new node values are the final node values, the new node values correspond to a solution of a computational problem mapped to the neural network.

20. A hardware accelerator comprising:
- a first memristor crossbar array programmed to calculate node values of a neural network, wherein the nodes values are calculated in accordance with rules to reduce an energy function associated with the neural network, wherein the first memristor crossbar array comprises:
  - a plurality of row lines;
  - a plurality of column lines, wherein the plurality of row lines and the plurality of column lines intersect to form a matrix of memory cells;
  - a plurality of memory cells, wherein each memory cell is coupled to each combination of a row line and a column line in the matrix and each memory cell comprises a 2×2 array of memristors,
  - an input line coupled to each first row of memristors in the 2×2 array of memristors of the plurality of memory cells in the matrix;
  - an inverter coupled to the input line; and
  - an inverted input line coupled to a second row of memristors in the 2×2 array of memristors of the plurality of memory cells in the matrix; and
- a second memristor crossbar array coupled to the first memristor crossbar array and programmed to introduce noise signals into the neural network, wherein the noise signals are introduced such that the energy function associated with the neural network converges towards a global minimum and modifies the calculated node values, the second crossbar array comprising:
  - a first noise line;
  - a plurality of second noise lines; and
  - a plurality of noise memory cells, wherein each of the plurality of noise memory cells are coupled across an intersection of the first noise line and one of the plurality of second noise lines, wherein a number of the plurality of second lines is equal to:
- a number of the plurality of column lines for the first crossbar array such that each of the plurality of second noise lines is connected to one of the plurality of column lines for the first crossbar array, or
- a number of the plurality of row lines for the first crossbar array such that each of the plurality of second noise lines is connected to one of the plurality of row lines for the first crossbar array.

* * * * *